United States Patent [19]

Barre

[11] Patent Number: 4,546,271
[45] Date of Patent: Oct. 8, 1985

[54] INTEGRATED LOGIC ELEMENT IN E²CL TECHNOLOGY

[75] Inventor: Claude Barre, Munich, Fed. Rep. of Germany

[73] Assignee: Siemens Aktiengesellschaft, Berlin & Munich, Fed. Rep. of Germany

[21] Appl. No.: 516,314

[22] Filed: Jul. 22, 1983

[30] Foreign Application Priority Data

Aug. 17, 1982 [DE] Fed. Rep. of Germany ....... 3230591

[51] Int. Cl.⁴ ................. H03K 19/086; H03K 19/003; H03K 17/60
[52] U.S. Cl. .................................... 307/443; 307/455; 307/299 A; 307/363; 324/51
[58] Field of Search ............. 307/443, 455, 467, 494, 307/362, 363, 299 A; 371/57, 63, 71; 324/51, 52

[56] References Cited

U.S. PATENT DOCUMENTS 3,538,348  11/1970  Hillis et al. .............. 307/299 A X
3,676,712  7/1972   Schendel, Jr. ........... 307/299 A X
4,151,609  4/1979   Moss ........................... 307/458 X Primary Examiner—Stanley D. Miller
Assistant Examiner—David R. Bertelson
Attorney, Agent, or Firm—Hill, Van Santen, Steadman & Simpson

[57] ABSTRACT

The invention relates to an integrated logic element constructed in E²CL technology. In order to be able to reliably identify the contacting of the collector of a transistor in a differential amplifier at which no output signal is tapped, and which contact may be missing, and identifying the same in a static check, a second emitter is provided at least this transistor and connected to the collector of the other transistor of the differential amplifier.

2 Claims, 3 Drawing Figures

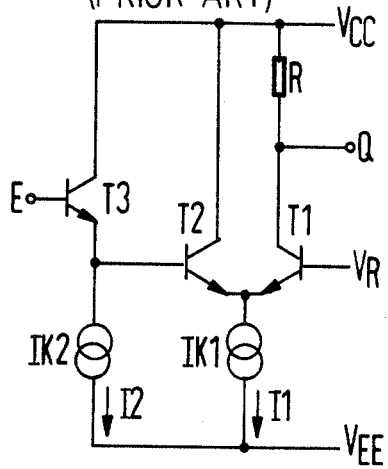
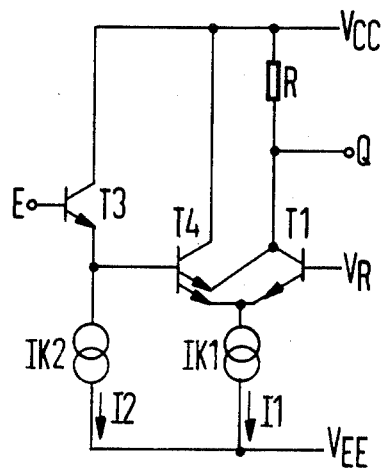
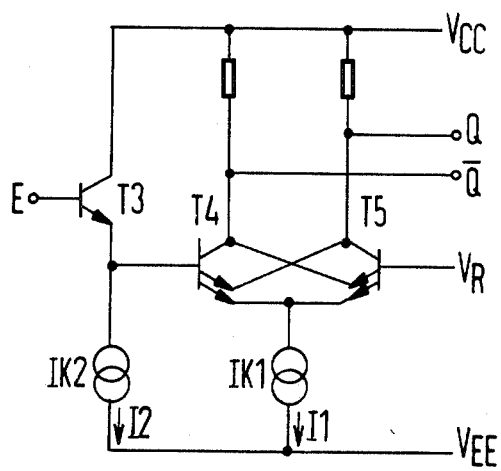

# INTEGRATED LOGIC ELEMENT IN E²CL TECHNOLOGY

BACKGROUND OF THE INVENTION

1. Field of the Invention

The present invention relates to a logic element constructed in E²CL technology, and more particularly to a logic element which comprises a differential amplifier including two emitter-coupled transistors having emitter-side constant current feed.

2. Description of the Prior Art

The basic element of logic elements constructed in E²CL technology is, as known, a differential amplifier having two transistors whose emitters are connected together. A constant current is fed in at the junction of the emitters. The base of one of the transistors is connected to a fixed reference potential, while the base of the other transistor is connected to the emitter of a further transistor, connected as an emitter follower, the further transistor being controlled by an input signal. A collector load resistor is provided for each transistor of the differential amplifier.

Two complementary output signals can be tapped at the collectors. When only one output signal is required, then the collector resistor of the transistor at which no output signal is tapped can be eliminated. The collector of this transistor is directly connected to the collector power supply.

Integrated modules are checked before use in larger circuit aggregates, since subsequent localization of faulty modules and their replacement is frequently a very laborious and time consuming operation. The check of integrated modules for the elimination of faulty units occurs by applying bit patterns and, insofar as required, clock signals, to the input terminals and by observing the derived output signals. Purely dynamic measurements, such as the measurement of signal transit times and signal-to-noise ratios, are not carried out. However, internal circuit faults can exist which are generally not perceptible given such a check but, which, for example reduce the reliability from disruption or increase the signal transit time and, therefore, lead to outages given use in a system.

Such a fault which is usually not perceptible exists in circuit arrangements of E²CL technology when the collector of that transistor in the differential amplifier at which no output signal is tapped is not connected due to a manufacturing error.

SUMMARY OF THE INVENTION

The object of the present invention is to provide a logic element, constructed in E²CL technology, such that the above-mentioned fault is sure to be perceived in a routine module check without changing the normal operation.

The above object is achieved, according to the present invention, and is characterized in that at least that transistor of the two transistors of the differential amplifier at which no output signal is tapped exhibits a second emitter which is connected to the collector of the other transistor.

BRIEF DESCRIPTION OF THE DRAWINGS

Other objects, features and advantages of the invention, its organization, construction and operation will be best understood from the following detailed description, taken in conjunction with the accompanying drawing, on which:

FIG. 1 is a schematic circuit diagram of a known logic element which will be discussed below for the purpose of a better understanding of the invention;

FIG. 2 is a schematic circuit diagram of a first embodiment of the invention; and FIG. 3 is a schematic circuit diagram of a second embodiment of the invention.

DESCRIPTION OF THE PREFERRED EMBODIMENTS

Referring first to the prior art circuit of FIG. 1, a differential amplifier is illustrated as comprising a transistor T1 and a transistor T2. A current source IK1 feeds a constant current I1 into the junction of the two emitters. The base of the transistor T1 is connected to a fixed reference potential $V_R$. The base of the transistor T2 is connected to the emitter of the transistor T3 operated as an emitter follower. A current source IK2 supplies the emitter follower with a constant current I2. An input signal E is applied to the base of the transistor T3. An output signal $Q=E$ is tapped only at the collector of the transistor T1. Only one collector resistor R is therefore provided. A collector resistor for the transistor T2 can be omitted.

As a fault case, let it be assumed that the necessary connection of the collector of the transistor T2 to the terminal $V_{CC}$ of the supply voltage does not exist. Given $E=L$ (lower binary signal level), the logic element operates normally since the transistor T2 is blocked anyway. When, however, $E=H$ (high binary signal level), then the entire current I1 flows through the transistor T3 (in addition to the current I2) and over the base-emitter diode of the transistor T2. The transistor T1 is then blocked as in the normal case. Since, however, the voltage drop at the base-emitter diode deviates from the voltage drop at the collector-emitter path, the switch threshold is displaced, this negatively influencing the reliability from disruption. The signal transit time is also lengthened because the transistor T2 is saturated.

FIG. 2 illustrates a logic element constructed in accordance with the present invention and which is largely identical to the known circuit arrangement of FIG. 1. Deviating from the circuit of FIG. 1, however, a transistor T4 is provided in place of the transistor T2 and includes two emitters. The second emitter is connected to the collector of the transistor T1. If one further assumes that the collector of the transistor T4 is not connected, then, given a high signal level $E=H$ at the input, a current flows over the second emitter (which, so to speak, assumes the role of the actual, but not connected collector) and over the collector resistor R of the transistor T1. A voltage drop arises at the collector resistor R so that a level occurs at the output Q which at least approximately corresponds to the low binary signal level. The assumed fault is thus reliably perceptible since, given the assumed preconditions, the high binary signal level would have to be available at the output Q given a fault-free circuit arrangement.

Application of the above circuit measure, according to the present invention, is also advantageous when only the inverting output $\overline{Q}$ is employed. When, in particular, the connection to the collector of the transistor T1 (FIG. 1) is missing, the current load of the reference voltage source rises considerably, but this is generally provided in common for a multitude of circuit elements in an integrated module and is therefore loadable at least to such a degree that the reference potential $V_R$ changes by less than half the signal change. In this case, the transistor T1 must be equipped with a second emitter which is connected to the collector of the transistor T2. The perceptible false signal at the output $\overline{Q}$ arises given an input level E=L.

FIG. 3 illustrates an exemplary embodiment of the invention which is preferably employed when only the output Q or $\overline{Q}$ is employed, but wherein the circuit design is not yet determined as to which of the two outputs is to be utilized (programmable circuit arrangements). As can be seen from the drawing, the transistor T4 again replaces the transistor T2 and the transistor T1 is replaced by a multi-emitter transistor T5. The additional emitter of the transistor T4 is cross coupled to the collector of the transistor T5, and the additional emitter of the transistor T5 is coupled to the collector of the transistor T4.

The circuit measure of the present invention can also be employed given logic elements having series coupling (series gating) or collector coupling (collector dotting).

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In an integrated logic element of the type having a differential amplifier comprising first and second transistors each including a base, a collector and an emitter, in which the two emitters are connected together and fed by a first constant current source, the collectors are connected to a voltage source with a resistor connecting the collector of the first transistor to the voltage source, the collector of the second transistor connected directly to the voltage source, and an output tap connected to the collector of the first transistor, in which the base of the first transistor is connected to a reference potential, and in which a third transistor includes a collector connected to the voltage source, an emitter fed by a second constant current source and connected to the base of the second transistor, and a base serving as an input for receiving logic signals, the improvement therein comprising:

an additional emitter included in the second transistor and connected to the collector of the first transistor so that the integrity of the connection of the collector thereof to the voltage source can be determined at the output tap in response to the application of a predetermined logic signal to the base of the third transistor.

2. In an integrated logic element of the type having a differential amplifier comprising first and second transistors each including a base, a collector and an emitter, in which the two emitters are connected together and fed by a first constant current source, the collectors are connected to a voltage source by way of respective load resistors and respective output taps connected to the collectors of the first and second transistors, in which the base of the first transistor is connected to a reference potential, and in which a third transistor include a collector connected to the voltage source, an emitter fed by a second constant current source and connected to the base of the second transistor, and a base serving as an input for receiving logic signals, the improvement therein comprising:

a first additional emitter included in the first transistor and connected to the collector of the second transistor; and a second additional emitter included in the second transistor and connected to the collector of the first transistor.

* * * * *